(12) United States Patent
Hara et al.

(10) Patent No.: US 10,528,203 B2
(45) Date of Patent: Jan. 7, 2020

(54) METHOD OF DESIGNING MESH PATTERN OF CONDUCTIVE FILM FOR TOUCH PANEL, METHOD OF MANUFACTURING CONDUCTIVE FILM FOR TOUCH PANEL, AND CONDUCTIVE FILM FOR TOUCH PANEL

(71) Applicant: FUJIFILM Corporation, Tokyo (JP)

(72) Inventors: Daisuke Hara, Ashigarakami-gun (JP); Hiroshige Nakamura, Ashigarakami-gun (JP); Kensuke Katagiri, Ashigarakami-gun (JP); Masaya Nakayama, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 80 days.

(21) Appl. No.: 15/832,020

(22) Filed: Dec. 5, 2017

(65) Prior Publication Data

US 2018/0107304 A1 Apr. 19, 2018

Related U.S. Application Data

(63) Continuation of application No. PCT/JP2016/066364, filed on Jun. 2, 2016.

(30) Foreign Application Priority Data

Jul. 24, 2015 (JP) ................. 2015-147088

(51) Int. Cl.
*G06F 3/044* (2006.01)
*G06F 17/50* (2006.01)

(52) U.S. Cl.
CPC .......... *G06F 3/044* (2013.01); *G06F 17/5077* (2013.01); *G06F 2203/04112* (2013.01)

(58) Field of Classification Search
CPC .......... G06F 3/044; G06F 2203/04112; G06F 17/5077
See application file for complete search history.

(56) References Cited

U.S. PATENT DOCUMENTS

2014/0172379 A1 6/2014 Chang et al.
2014/0333555 A1 11/2014 Oh et al.
(Continued)

FOREIGN PATENT DOCUMENTS

JP 2013-37682 A 2/2013
JP 2013-69261 A 4/2013
(Continued)

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2016/066364, dated Feb. 8, 2018, including English translations thereof.

(Continued)

*Primary Examiner* — Charles V Hicks
(74) *Attorney, Agent, or Firm* — Birch, Stewart, Kolasch & Birch, LLP

(57) ABSTRACT

A method of designing a mesh pattern includes: a first step of tightly disposing a plurality of polygons having an arbitrary shape in an area to form a transparent active area; a second step of obtaining a circumcenter of each of the polygons; a third step of disposing one arbitrary point in each of the polygons to be positioned at a distance, which is less than ½ a radius of a circumscribed circle of the polygon, from the circumcenter; a fourth step of forming a pattern to form second cells by connecting two arbitrary points corresponding to two polygons that share each of sides of the polygons; and a fifth step of forming a pattern to form first cells using the polygons, in which the polygons having a (Continued)

random shape are disposed in the first step, and/or the arbitrary point is randomly disposed in the third step.

20 Claims, 5 Drawing Sheets

(56) References Cited

U.S. PATENT DOCUMENTS

2015/0070292 A1* 3/2015 Saran ................ H03K 17/9622
  345/174
2016/0274702 A1   9/2016 Satou et al.

FOREIGN PATENT DOCUMENTS

| | | |
|---|---|---|
| JP | 2014-119764 A | 6/2014 |
| JP | 2014-219986 A | 11/2014 |
| JP | 2015-108885 A | 6/2015 |
| JP | 2015-108896 A | 6/2015 |

OTHER PUBLICATIONS

International Search Report (Form PCT/ISA/210) for International Application No. PCT/JP2016/066364, dated Jul. 19, 2016, including an English Translation thereof.
Korean Office Action for corresponding Korean Application No. 10-2017-7035300, dated Feb. 26, 2019, with English translation.
Japanese Notification of Reasons for Refusal and English translation for Application No. 2017-531057, dated Nov. 13, 2018.

* cited by examiner

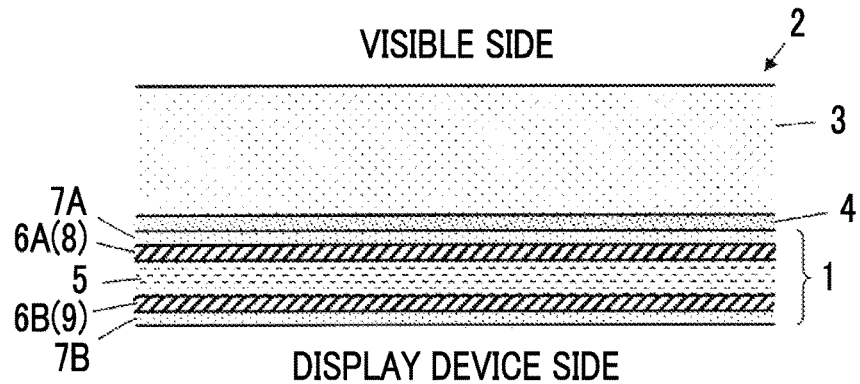
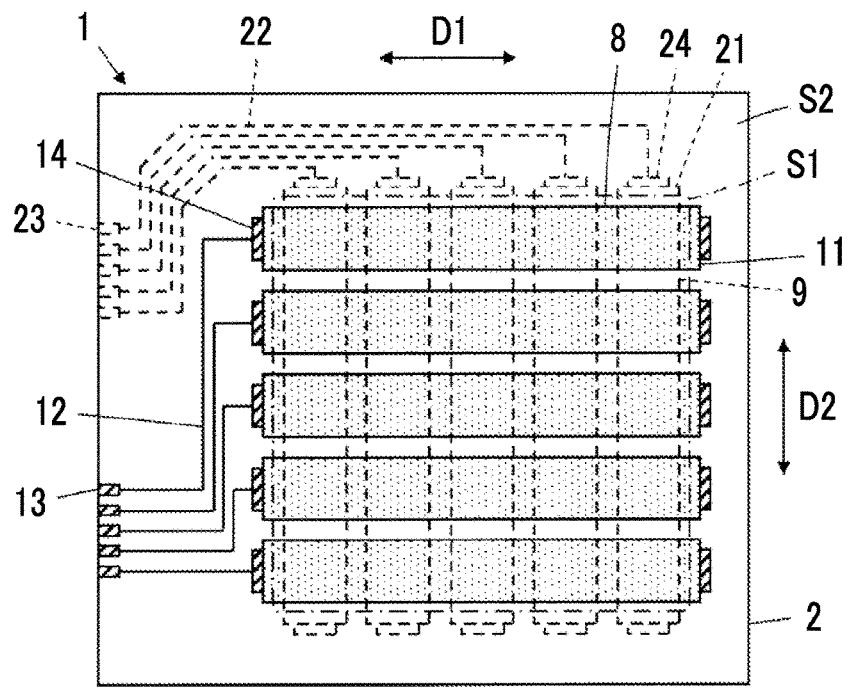
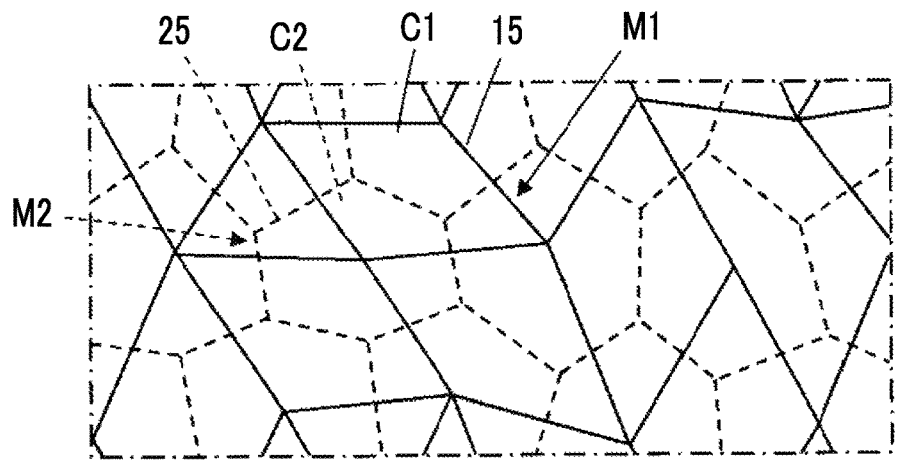

METHOD OF DESIGNING MESH PATTERN OF CONDUCTIVE FILM FOR TOUCH PANEL, METHOD OF MANUFACTURING CONDUCTIVE FILM FOR TOUCH PANEL, AND CONDUCTIVE FILM FOR TOUCH PANEL

CROSS-REFERENCE TO RELATED APPLICATIONS

This application is a Continuation of PCT International Application No. PCT/JP2016/66364, filed on Jun. 2, 2016, which claims priority under 35 U.S.C. § 119(a) to Japanese Patent Application No. 2015-147088, filed on Jul. 24, 2015. Each of the above application(s) is hereby expressly incorporated by reference, in its entirety, into the present application.

BACKGROUND OF THE INVENTION

1. Field of the Invention

The present invention relates to a method of designing a mesh pattern of a conductive film for a touch panel, and particularly relates to a method of designing a mesh pattern in which a plurality of polygonal cells are formed of a thin metal wire.

In addition, the present invention also relates to a method of manufacturing a transparent conductive film for a touch panel having the mesh pattern, and a conductive film for a touch panel.

2. Description of the Related Art

Recently, in various electronic apparatuses such as a portable information apparatus, the use of a touch panel has increased, the touch panel being used in combination with a display device such as a liquid crystal display device and performing an input operation on an electronic apparatus when a screen is touched. Since the costs and the resistance can be reduced, a touch panel using a detecting electrode formed of a metal mesh has been developed.

A metal mesh is formed of a thin metal wire having a mesh-like pattern. For example, a detecting electrode formed of a metal mesh is disposed on each of opposite surfaces of a transparent substrate.

However, in a case where a metal mesh has a periodic pattern, a thin metal wire interferes with a periodic pixel pattern of a display device used in combination with a touch panel, and so-called moire is likely to occur.

Therefore, JP2013-69261A discloses a touch panel using an irregular polygonal metal mesh.

SUMMARY OF THE INVENTION

However, in a case where an irregular polygonal metal mesh is used as electrodes of a capacitive touch panel, there are problems in that, in regions (electrode intersections) where the electrodes of the touch panel overlap each other, portions where thin metal wires constituting the electrodes are disposed to overlap each other are formed, portions having a locally high parasitic capacitance value are formed in the electrode intersections of the touch panel, the detection sensitivity of the touch panel deteriorates, and the responsiveness deteriorates.

The present invention has been made in order to solve the problems of the related art, and an object thereof is to provide a method of designing a mesh pattern of a conductive film for a touch panel in which the occurrence of moire caused by interference with a pixel pattern of a display device can be reduced, the detection sensitivity can be improved, and the responsiveness can be improved.

In addition, another object of the present invention is to provide a method of manufacturing a transparent conductive film for a touch panel having the mesh pattern, and a conductive film for a touch panel.

According to the present invention, there is provided a method of designing a mesh pattern of a conductive film for a touch panel, the conductive film including a first conductive layer that includes a first thin metal wire disposed along a first mesh pattern formed of a plurality of first cells having a polygonal shape, and a second conductive layer that includes a second thin metal wire disposed along a second mesh pattern formed of a plurality of second cells having a polygonal shape, in which the first conductive layer and the second conductive layer are disposed to overlap each other in a transparent active area, and at least one of the first mesh pattern or the second mesh pattern is a random pattern. This method includes: a first step of tightly disposing a plurality of polygons having an arbitrary shape in the active area; a second step of obtaining a circumcenter of each of the polygons; a third step of disposing one arbitrary point in each of the polygons to be positioned at a distance, which is less than ½ a radius of a circumscribed circle of the polygon, from the circumcenter; a fourth step of forming the second cells by connecting two arbitrary points corresponding to two polygons that share each of sides of the polygons; and a fifth step of forming the first cells using the polygons, in which the polygons having a random shape are disposed in the first step, and/or the arbitrary point is randomly disposed in the third step.

In a case where polygons other than triangles are disposed in the first step, it is preferable that regular polygons are used. In this case, the first mesh pattern formed of the first cells is not a random pattern. However, by disposing the arbitrary points in the third step, the second mesh pattern formed of the second cells is a random pattern.

It is preferable that the polygons disposed in the first step are formed of a plurality of triangles. Further, it is preferable that the triangles disposed in the first step have a random shape. The reason for this is that a triangle has a circumscribed circle and a circumcenter irrespective of a shape of the triangle. A quadrangle has a circumscribed circle and a circumcenter in a case where the sum of opposite interior angles is 180 degrees. Therefore, a plurality of random quadrangles can also be used on the condition that the sum of opposite interior angles is 180 degrees.

It is preferable that each of the polygons disposed in the first step has a random polygonal shape in which an average value of inter-apex distances is 300 to 900 μm and in which a maximum difference between an arbitrary inter-apex distance and the average value of the inter-apex distances is 50 to 500 μm. Each of the polygons disposed in the first step can be formed by moving each of apexes of a regular polygon having one side length of 300 to 900 μm in a preset movement tolerance range of 25 to 250 μm. At this time, it is preferable that the movement tolerance of each of the apexes is set to be less than the one side length of the regular polygon.

In a case where the method further includes a step of determining line widths of the first thin metal wire and the second thin metal wire and the line widths of the first thin metal wire and the second thin metal wire are set to be 1 μm to 3 μm, it is preferable that each of the polygons disposed in the first step has a random polygonal shape in which an average value of inter-apex distances is 500 to 900 µm and in which a maximum difference between an arbitrary inter-apex distance and the average value of the inter-apex distances is 100 to 500 µm. Each of the polygons can be formed by moving each of apexes of a regular polygon having one side length of 500 to 900 µm in a movement tolerance range of 50 to 250 µm. At this time, it is preferable that the movement tolerance of each of the apexes is set to be less than the one side length of the regular polygon.

It is preferable that the arbitrary point disposed in each of the triangles in the third step matches with a circumcenter of the triangle.

As the first cells formed in the fifth step, the triangles disposed in the first step can be used as they are. Alternatively, at least one of the first cells formed in the fifth step may be a polygon having four or more apexes that is formed by merging at least portions of triangles adjacent to each other among the triangles disposed in the first step.

It is preferable that the method further includes a step of determining line widths of the first thin metal wire and the second thin metal wire, and it is preferable that, in the fifth step, the first cells are formed such that a difference between an opening ratio of the first mesh pattern and an opening ratio of the second mesh pattern in the active area is 1.0% or lower with respect to the determined line widths of the first thin metal wire and the second thin metal wire.

According to the present invention, there is provided a method of manufacturing a conductive film for a touch panel, the method comprising: disposing the first conductive layer formed of the first thin metal wire and the second conductive layer formed of the second thin metal wire to overlap each other in a transparent active area, the first conductive layer and the second conductive layer having the first mesh pattern and the second mesh pattern designed using the method of designing a mesh pattern of a conductive film for a touch panel, respectively.

According to the present invention, there is provided a conductive film for a touch panel, the conductive film comprising: a first conductive layer that includes a first thin metal wire disposed along a first mesh pattern formed of a plurality of first cells having a polygonal shape; a second conductive layer that includes a second thin metal wire disposed along a second mesh pattern formed of a plurality of second cells having a polygonal shape, in which the first conductive layer and the second conductive layer are disposed to overlap each other in a transparent active area, the second cells have a random shape, each of the second cells includes at most one apex of the first cells in a case where the conductive film is seen from a direction perpendicular to the active area, and sides of the first cells and sides of the second cells intersect with each other at an average angle of 75 degrees to 90 degrees in the active area.

It is preferable that the first cells are formed of a plurality of polygons tightly disposed in the active area. The polygons are formed of a plurality of triangles. Further, it is preferable that the polygons have a random shape.

It is preferable that each of the first cells has a random polygonal shape in which an average value of inter-apex distances is 300 to 900 µm and in which a maximum difference between an arbitrary inter-apex distance and the average value of the inter-apex distances is 50 to 500 µm.

It is preferable that a difference between an opening ratio of the first mesh pattern and an opening ratio of the second mesh pattern in the active area is 1.0% or lower.

It is preferable that line width of the first thin metal wire and the second thin metal wire are 1 µm to 3 µm. It is more preferable that each of the first cells has a random polygonal shape in which an average value of inter-apex distances is 500 to 900 µm and in which a maximum difference between an arbitrary inter-apex distance and the average value of the inter-apex distances is 100 to 500 µm.

A configuration may be adopted in which the first conductive layer may include at least a plurality of first electrodes and a plurality of first dummy electrodes, the first electrodes are disposed at intervals, the first dummy electrodes are disposed between the first electrodes and are insulated from the first electrodes, the second conductive layer includes at least a plurality of second electrodes and a plurality of second dummy electrodes, the second electrodes are disposed at intervals to intersect with the first electrodes, the second dummy electrodes are disposed between the second electrodes and are insulated from the second electrodes, and the first electrodes and the second electrodes are disposed in a state where the first electrodes and the second electrodes are insulated from each other.

According to the present invention, in a conductive film for a touch panel that includes a first conductive layer having a first mesh pattern formed of a plurality of first cells and a second conductive layer having a second mesh pattern formed of a plurality of second cells and in which at least one of the first mesh pattern or the second mesh pattern is a random pattern, arbitrary points of a plurality of polygons at distances, which are less than ½ of radii of circumscribed circles of the polygons, from circumcenters are connected to form the second cells, and the first cells are formed using the polygons. Therefore, the occurrence of moire caused by interference with a pixel pattern of a display device can be reduced, the detection sensitivity of the touch panel can be improved, and the responsiveness can be improved.

BRIEF DESCRIPTION OF THE DRAWINGS

FIG. 1 is a partial cross-sectional view showing a touch panel using a conductive film for a touch panel according to Embodiment 1 of the present invention.

FIG. 2 is a plan view showing the conductive film for a touch panel according to Embodiment 1.

FIG. 3 is a partial plan view showing a first mesh pattern and a second mesh pattern of the conductive film for a touch panel according to Embodiment 1.

DESCRIPTION OF THE PREFERRED EMBODIMENTS

Figure 4A:
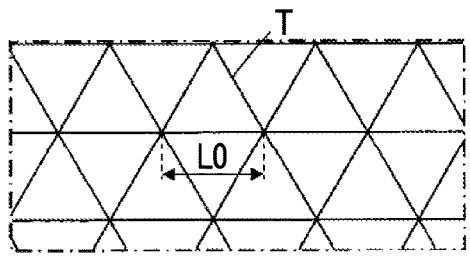
FIGS. 4A to 4J are diagrams showing a method of designing a mesh pattern of the conductive film for a touch panel according to Embodiment 1 in order of steps.
Figure 4F:
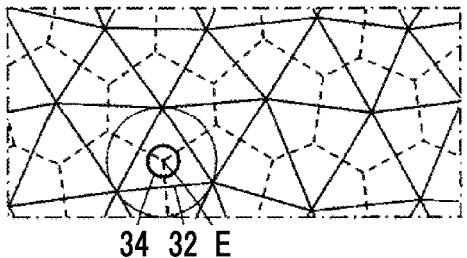
Figure 4B:
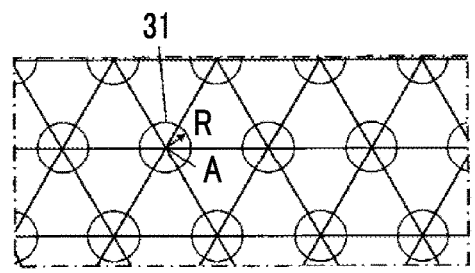
Figure 4G:
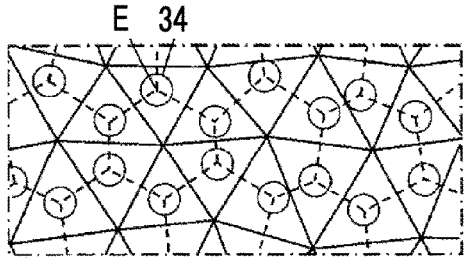
Figure 4C:
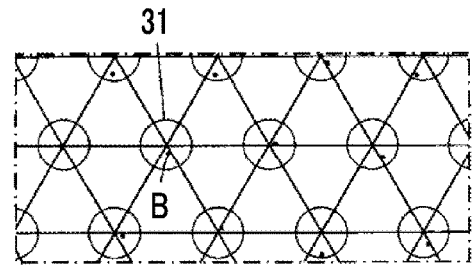
Figure 4H:
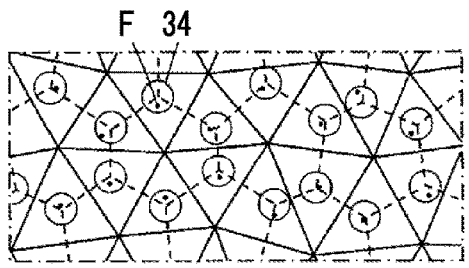
Figure 4D:
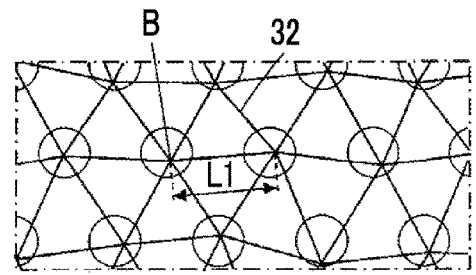
Figure 4I:
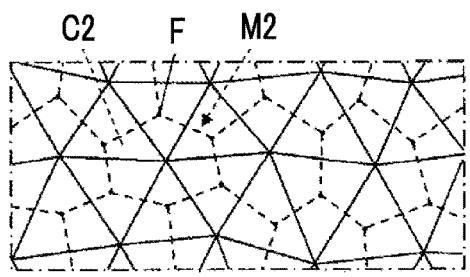
Figure 4E:
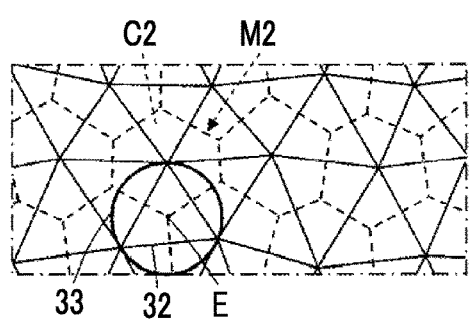
Figure 4J:
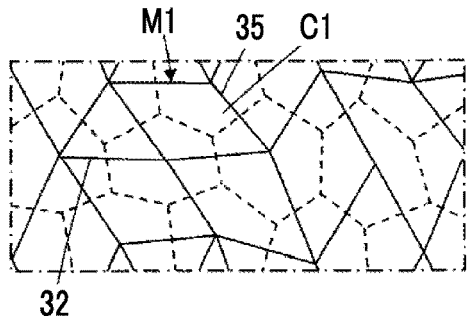
Figure 5A:
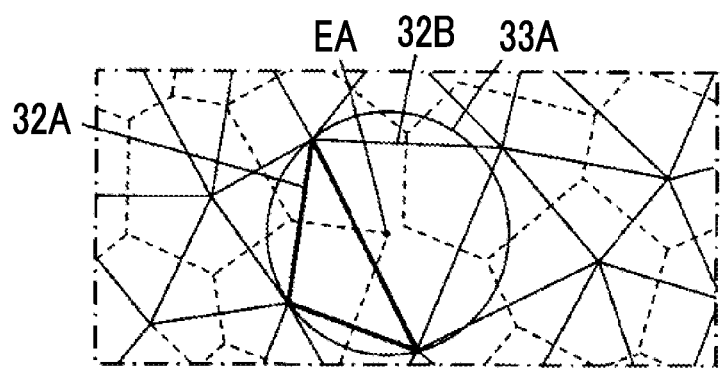
FIGS. 5A to 5D are diagrams showing a method of designing a mesh pattern of the conductive film for a touch panel according to Embodiment 1 in order of steps in a case where a circumcenter is positioned outside of a triangle.
Figure 5B:
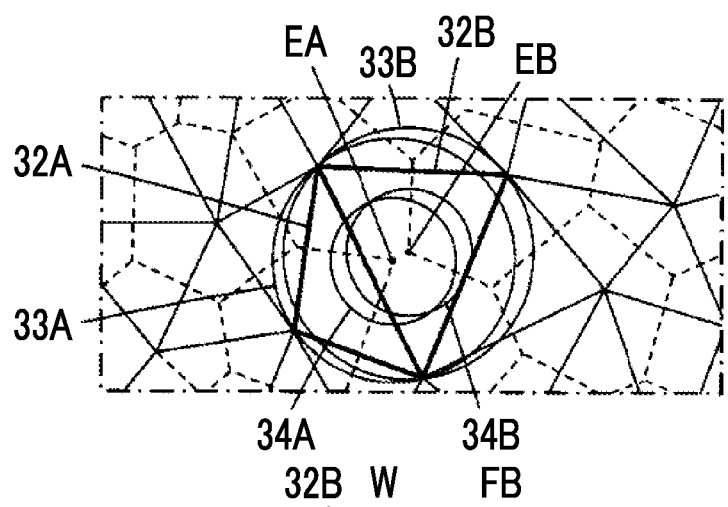
Figure 5C:
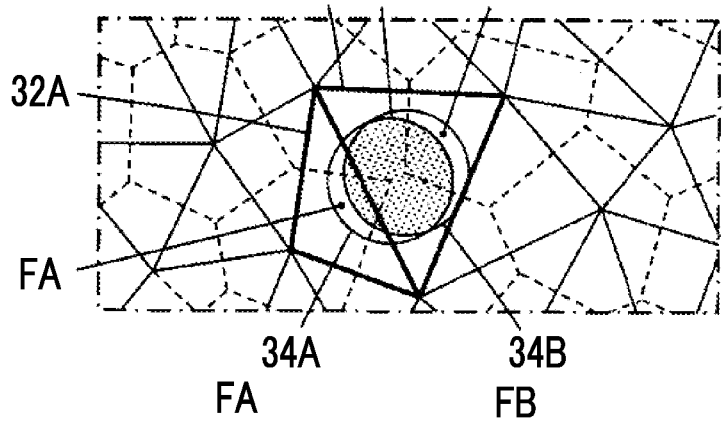
Figure 5D:
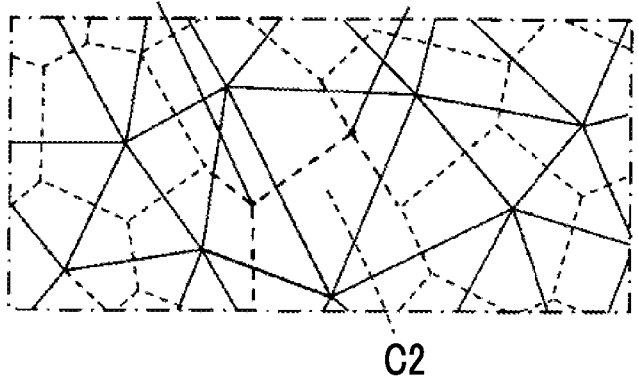

Hereinafter, embodiments of the present invention will be described with reference to the accompanying drawings.

Embodiment 1

FIG. 1 shows a configuration a touch panel 2 using a conductive film 1 for a touch panel according to Embodiment 1 of the present invention. The touch panel 2 is used in combination with a display device, and the display device is disposed on a display device side of FIG. 1. A visible side shown in FIG. 1 refers to a side where an operator of the touch panel can see an image of the display device. The touch panel 2 includes a transparent insulating cover panel 3 having a flat plate shape, and the conductive film 1 for a touch panel is joined to a surface of the cover panel 3 opposite to the visible side through a transparent adhesive 4. In the conductive film 1 for a touch panel, conductive members 6A (first conductive layer 8) and 6B (second conductive layer 9) are formed on opposite surfaces of a flexible transparent insulating substrate 5, respectively.

In addition, as shown in FIG. 1, for planarization or protection of the conductive members 6A and 6B, transparent protective layers 7A and 7B may be disposed on opposite surfaces of the transparent insulating substrate 5 so as to cover the conductive members 6A and 6B, respectively.

As shown in FIG. 2, the conductive film 1 for a touch panel is partitioned into a transparent active area S1 and the peripheral area S2 positioned outside of the active area S1.

In the active area S1, the first conductive layer 8 and the second conductive layer 9 are disposed to overlap each other, the first conductive layer 8 being formed on a front surface (visible side) of the transparent insulating substrate 5, and the second conductive layer 9 being formed on a back surface (display device side) of the transparent insulating substrate 5.

The first conductive layer 8 on the front surface of the transparent insulating substrate 5 forms a plurality of first electrodes 11 that extend in a first direction D1 and are disposed in parallel in a second direction D2 perpendicular to the first direction D1. The second conductive layer 9 on the back surface of the transparent insulating substrate 5 forms a plurality of second electrodes 21 that extend in the second direction D2 and are disposed in parallel in the first direction D1.

The first electrodes 11 and the second electrodes 21 configure a detecting electrode of the touch panel 2.

In the peripheral area S2, a plurality of first peripheral wirings 12 connected to the first electrodes 11 are formed on the front surface of the transparent insulating substrate 5, a plurality of first external connection terminals 13 are disposed and formed in an edge portion of the transparent insulating substrate 5, and first connector portions 14 are formed in opposite ends of each of the first electrodes 11. One end portion of the corresponding first peripheral wiring 12 is connected to the first connector portion 14, and the other end portion of the first peripheral wiring 12 is connected to the corresponding first external connection terminal 13.

Likewise, In the peripheral area S2, a plurality of second peripheral wirings 22 connected to the second electrodes 21 are formed on the back surface of the transparent insulating substrate 5, a plurality of second external connection terminals 23 are disposed and formed in an edge portion of the transparent insulating substrate 5, and second connector portions 24 are formed in opposite ends of each of the second electrodes 21. One end portion of the corresponding second peripheral wiring 22 is connected to the second connector portion 24, and the other end portion of the second peripheral wiring 22 is connected to the corresponding second external connection terminal 23.

As shown in FIG. 3, the first electrodes 11, which are disposed on the front surface of the transparent insulating substrate 5, include a first thin metal wire 15 that is disposed along a first mesh pattern M1 formed of a plurality of first cells C1 having a polygonal shape. The second electrodes 21, which are disposed on the back surface of the transparent insulating substrate 5, include a second thin metal wire 25 that is disposed along a second mesh pattern M2 formed of a plurality of second cells C2 having a polygonal shape.

At least one of the first mesh pattern M1 or the second mesh pattern M2 is a random pattern. The random pattern denotes that, regarding shapes of the cells forming the mesh pattern, the shape of one cell is different from that of at least one cell adjacent to the cell, and it is preferable that the shapes of all the adjacent cells C are different from each other. As shown in FIG. 3, a configuration is preferable in which both the first mesh pattern M1 and the second mesh pattern M2 are random patterns and that shapes of all the adjacent cells among the first cells C1 and the second cells C2 have different random polygonal shapes.

As shown in FIG. 3, in a case where the conductive film is seen from the direction perpendicular to the active area S1, each of the second cells C2 include at most one apex of the first cells C1. It is preferable that each of the second cells C2 includes one apex of the first cells C1.

Further, in a case where the conductive film is seen from the direction perpendicular to the active area S1, the first cells C1 have a plurality of sides, the second cells C2 have a plurality of sides, and the sides of the first cells C1 intersect with the sides of the second cells C2 in a plurality of positions. In this case, the sides of the first cells C1 of the first mesh pattern M1 intersect with the sides of the second cells C2 of the second mesh pattern M2 at an average angle of 75 degrees to 90 degrees in the active area S1. That is, the sides of the first cells C1 intersect with the sides of the second cells C2 in a shape in which the sides of the first cells C1 are not adjacent to and parallel to the sides of the second cells C2 in the same direction.

The first cells C1 are formed using a plurality of triangles having a random shape which are tightly disposed in the active area S1. The first cells C1 include: first cells C1 having a triangular shape as it is; and first cells C1 having a polygonal shape with four or more apexes in which at least portions of a plurality of adjacent triangles are merged. FIG. 3 shows the first cells C1 formed of quadrangles having four apexes which are formed by merging at least portions of triangles adjacent to each other among the triangles.

The first electrodes 11 and the second electrodes 21 disposed on the opposite surfaces of the transparent insulating substrate 5 have the first mesh pattern M1 and the second mesh pattern M2, respectively. Therefore, in a case where the touch panel 2 using the conductive film 1 for a touch panel is used in combination with a liquid crystal display device or the like, the occurrence of moire caused by interference with a pixel pattern of the liquid crystal display device can be reduced, the parasitic capacitance of electrode intersections of the touch panel can be reduced, and the formation of portions having a locally high parasitic capacitance value can be suppressed. Therefore, the detection sensitivity can be improved, and the responsiveness of the touch panel can be improved.

In a case where the touch panel 2 is configured using the conductive film 1 for a touch panel, the same effects can be obtained irrespective of whether the first mesh pattern M1 or the second mesh pattern M2 is disposed on the visible side.

As a material of the cover panel 3 constituting the conductive film 1 for a touch panel, for example, reinforced glass, sapphire, polycarbonate (PC), or a polymethyl methacrylate resin (PMMA) can be used, and the thickness of the cover panel 3 is preferably 0.1 to 1.5 mm. In the cover panel 3, a decorative layer that prevents light from transmitting through the peripheral area S2 may be used.

As a material of the transparent insulating substrate 5, for example, glass, polyethylene terephthalate (PET), polyethylene naphthalate (PEN), a cycloolefin polymer (COP), a cycloolefin copolymer (COC), or polycarbonate (PC) can be used, and the thickness of the transparent insulating substrate 5 is preferably 20 to 200 μm.

As the transparent pressure sensitive adhesive 4, an optical transparent adhesive sheet (optical clear adhesive) or an optical transparent adhesive resin (optical clear resin) can be used, and the thickness thereof is preferably 10 to 100 μm. As the optical transparent adhesive sheet, for example, 8146 series (manufactured by 3M) can be used.

As the transparent protective layers 7A and 7B, for example, an organic film such as gelatin, an acrylic resin, or a urethane resin, or an inorganic film such as silicon dioxide can be used, and the thickness thereof is preferably 10 nm to 100 nm.

Here, a method of designing the first mesh pattern M1 and the second mesh pattern M2 will be described below.

First, as shown in part A of FIG. 4, a plurality of regular triangles T having one side length L0 are tightly disposed in the active area S1.

Next, a movement tolerance R of each of apexes is set, a circle 31 formed around an apex A of each of the regular triangles T and having a radius R is assumed as shown in part B of FIG. 4, and the apex A of each of the regular triangles T moves in the range of the movement tolerance R of the apex using a random number. As a result, a new apex B is created as shown in part C of FIG. 4. By connecting the new apexes B to each other as shown in part D of FIG. 4, a plurality of triangles 32 having a random shape are formed. At this time, the new apex B is obtained by moving each of the apexes A of the regular triangle T in the movement tolerance R range. Therefore, the triangles 32 formed of the new apexes B have various inter-apex distances L1 in a range of ±2R with respect to the one side length L0 of the regular triangle T. That is, $L0-2R \leq L1 \leq L0+2R$. Here, the inter-apex distance is the distances between apexes which form a polygon and are connected by a side. The distance between apexes which are not connected by a side is not included.

The movement tolerances R of the apexes are factors for determining the randomness of the triangles 32. In addition, it is preferable that the movement tolerance R of the apex is set to be less than the one side length L0 of the regular triangle T.

Further, as shown in part E of FIG. 4, a circumcenter E that is the center of a circumscribed circle 33 is obtained from each of the triangles 32 having a random shape.

Next, as shown in part F of FIG. 4, a circle 34 formed around the circumcenter E of the triangle 32 is assumed. Here, the radius of the circle 34 is less than ½ of the radius of the circumscribed circle 33 of the triangle 32. As shown in part G of FIG. 4, the circle 34 is assumed from each of the circumcenters E, and each of the circumcenters E moves using a random number in a range of ½ of the radius of the circumscribed circle 33 of the triangle 32. As a result, an arbitrary point F is created as shown in part H of FIG. 4.

As shown in part I of FIG. 4, Polygons obtained by connecting the arbitrary points F to each other are set as the second cells C2 of the second mesh pattern M2.

By forming the second cells C2 of the second mesh pattern M2 as described above, the sides of the first cells C1 of the first mesh pattern M1 can be made to intersect with the sides of the second cells C2 of the second mesh pattern M2 at an average angle of 75 degrees to 90 degrees in the active area S1, and the parasitic capacitance of the electrode intersections can be reduced.

Further, as shown in part J of FIG. 4, at least portions of adjacent triangles 32 are merged to form polygons 35 having four or more apexes. The triangles 32 and the polygons 35 are set as the first cells C1 of the first mesh pattern M1. In part J of FIG. 4, the polygons 35 are quadrangles having four apexes. In part J of FIG. 4, in consideration of the line widths of the first thin metal wire 15 and the second thin metal wire 25, it is preferable that a difference between an opening ratio of the first mesh pattern M1 and an opening ratio of the second mesh pattern M2 in the active area S1 is 1.0% or lower. In a case where the difference between the opening ratios is 1.0% or lower, the sheet resistances of the first electrodes 11 and the second electrodes 21 can be made to uniform, and the uniformity of the sensitivity of the touch panel can be improved.

This way, the first mesh pattern M1 and the second mesh pattern M2 can be designed such that the sides of the first cells C1 of the first mesh pattern M1 intersect with the sides of the second cells C2 of the second mesh pattern M2 at an average angle of 75 degrees to 90 degrees as shown in FIG. 3 in the active area S1.

From the viewpoint of reducing moire, it is preferable that the line widths of the first thin metal wire 15 and the second thin metal wire 25 are 0.5 μm to 5.0 μm.

In a case where the circumcenter E of the triangle 32 is obtained, a circumcenter EA of a triangle 32A in which one apex angle is an obtuse angle as shown in part A of FIG. 5 is positioned outside of the triangle 32A. Even in this case, the first mesh pattern M1 and the second mesh pattern M2 shown in FIG. 3 can be designed as described above.

For example, in a case where the circumcenter EA of the triangle 32A is positioned in a triangle 32B adjacent to the triangle 32A, as shown in part B of FIG. 5, a circle 34A formed around the circumcenter EA of the triangle 32A and having a radius, which is ½ of a radius of a circumscribed circle 33A of the triangle 32A, is assumed, and a circle 34B formed around a circumcenter EB of the triangle 32B and having a radius, which is ½ of a radius of a circumscribed circle 33B of the triangle 32B, is assumed.

As shown in part C of FIG. 5, an arbitrary point FA is created using a random number in a region of the circle 34A excluding an overlapping portion W between the circle 34A and the circle 34B, and an arbitrary point FB is created in a region of the circle 34B excluding the overlapping portion W. As shown in part D of FIG. 5, by connecting the arbitrary points FA, the arbitrary points FB, and the arbitrary points F created regarding other triangles 32 to each other, polygons which form the second cells C2 of the second mesh pattern M2 can be formed.

As shown in part D of FIG. 4, the triangles 32 having a random shape are formed using the new apexes B which are created by moving the apexes A of the regular triangles T in the range of the movement tolerances R. Therefore, in a case where an average value La of the inter-apex distances L1 of the first cells C1 of the designed first mesh pattern M1 is calculated, a maximum difference Dmax between an arbitrary inter-apex distance L1 and the average value La of the inter-apex distances L1 is at most twice the movement tolerance R of each of the apexes A. It is preferable that the number of samples of the inter-apex distances L for calculating the average value La is as much as possible. For example, the average value L1 can be obtained using 100 inter-apex distances in the active area S1.

Specifically, it is preferable that the triangles 32 for forming the first cells C1 of the first mesh pattern M1 are formed by moving the respective apexes of the regular triangles T having one side length L0 of 300 to 900 μm in a movement tolerance R range of 25 to 250 μm. In this case, the first cells C1 of the first mesh pattern M1 are designed to have a random polygonal shape in which the average value La of the inter-apex distances is 300 to 900 μm and in which the maximum difference Dmax between an arbitrary inter-apex distance L1 and the average value La of the inter-apex distances is 50 to 500 μm.

By adjusting the average value La of the inter-apex distances and the maximum difference Dmax between an arbitrary inter-apex distance L1 and the average value La of the inter-apex distances to be in the above-described ranges in the first cells C1 of the designed first mesh pattern M1, in a case where the conductive film 1 for a touch panel is used in combination with a display device, the occurrence of moire can be significantly reduced.

Further, in a case where the line widths of the first thin metal wire and the second thin metal wire are set to be 1 μm to 3 μm, it is preferable that the triangles 32 for forming the first cells C1 of the first mesh pattern M1 are formed by moving the respective apexes of the regular triangles T having one side length L0 of 500 to 900 μm in a movement tolerance R range of 100 to 500 μm. In this case, the first cells C1 of the first mesh pattern M1 are designed to have a random polygonal shape in which the average value La of the inter-apex distances is 500 to 900 μm and in which the maximum difference Dmax between an arbitrary inter-apex distance L1 and the average value La of the inter-apex distances is 100 to 500 μm.

By setting the line widths of the first thin metal wire and the second thin metal wire to be 1 μm to 3 μm and by adjusting the average value La of the inter-apex distances and the maximum difference Dmax between an arbitrary inter-apex distance L1 and the average value La of the inter-apex distances to be in the above-described ranges in the first cells C1 of the designed first mesh pattern M1, even in a case where the conductive film 1 for a touch panel is used in combination with various display devices having different resolutions, the occurrence of moire can b effectively reduced, and the occurrence of noise can be effectively suppressed.

Here, noise refers to, in a case where a display device and a conductive film having a mesh pattern are used in combination, density unevenness that is generated on a displayed image of a display device due to non-uniformity of a mesh pattern shape and coarseness and fineness of a thin metal wire. From the viewpoint of quality, it is preferable that noise is not generated.

Figure 6:
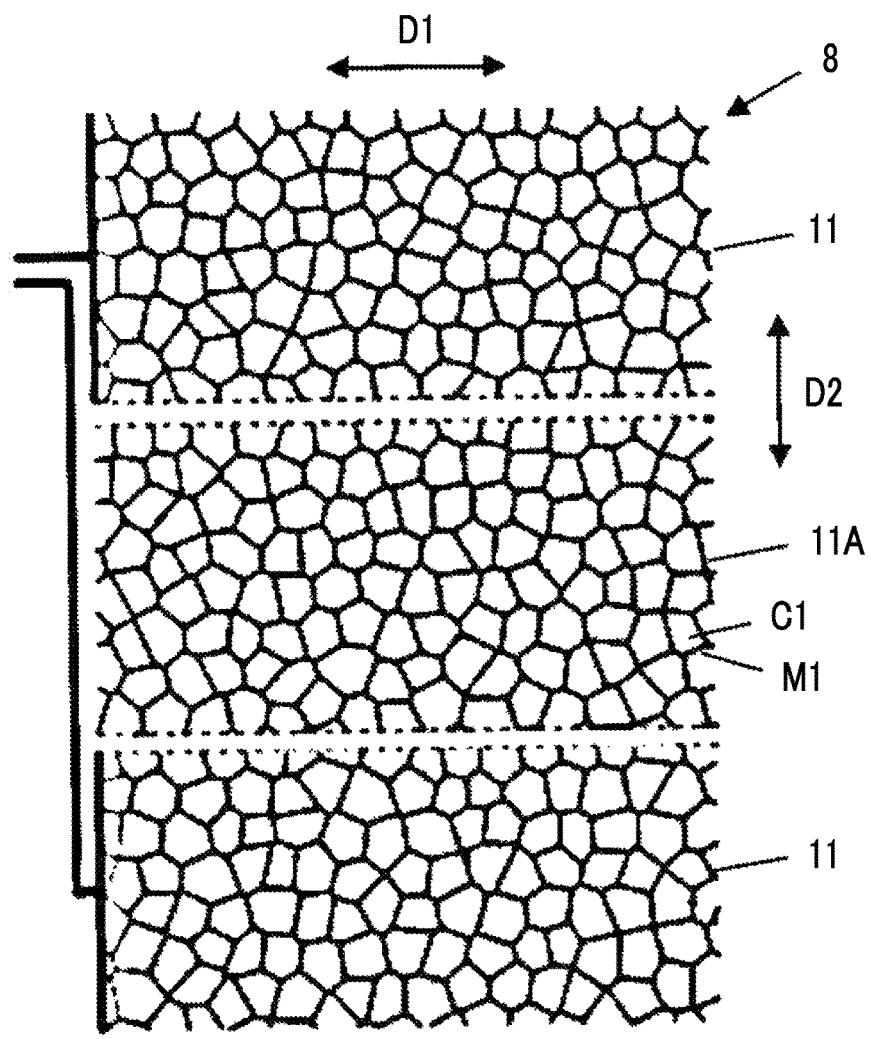
FIG. 6 is a diagram showing first electrodes and first dummy electrodes.

As shown in FIG. 6, the first conductive layer 8, which is disposed on the front surface of the transparent insulating substrate 5 in the active area S1, includes a plurality of first dummy electrodes 11A which are disposed between the first electrodes 11. The first dummy electrodes 11A are insulated from the first electrodes 11 and, as in the case of the first electrodes 11, includes the first mesh pattern M1 which is formed of a plurality of first cells C1 having a polygonal shape.

In addition, although not shown in the drawings, the second conductive layer 9, which is disposed on the back surface of the transparent insulating substrate 5 in the active area S1, includes a plurality of second dummy electrodes which are disposed between the second electrodes 21. The second dummy electrodes are insulated from the second electrodes 21 and, as in the case of the second electrodes 21, includes the second mesh pattern M2 which is formed of a plurality of second cells C2 having a polygonal shape.

Due to the presence of the first dummy electrodes 11A and the second dummy electrodes, even in spaces between the first electrodes 11 and spaces between the second electrodes 21, the first thin metal wire 15 disposed along the first mesh pattern M1 and the second thin metal wire 25 disposed along the second mesh pattern M2 overlap each other with the transparent insulating substrate 5 interposed therebetween. As a result, in a case where the touch panel 2 is used in combination with a liquid crystal display device or the like, the occurrence of moire can be reduced and electrode pattern appearance can be suppressed over the entire active area S1.

The conductive film 1 for a touch panel is manufactured using a method including: forming the conductive member 6A including the first electrodes 11, the first peripheral wirings 12, the first external connection terminals 13, and the first connector portions 14 on the front surface of the transparent insulating substrate 5; and forming the conductive member 6B including the second electrodes 21, the second peripheral wirings 22, the second external connection terminals 23, and the second connector portions 24 on the back surface of the transparent insulating substrate 5. At this time, the first electrodes 11 are formed of the first conductive layer 8 in which the first thin metal wire 15 disposed along the first mesh pattern M1, the second electrodes 21 are formed of the second conductive layer 9 in which the second thin metal wire 25 is disposed along the second mesh pattern M2, and the first conductive layer 8 and the second conductive layer 9 are disposed so as to overlap with each other with the transparent insulating substrate 5 interposed therebetween in the active area S1.

A method of forming the conductive members 6A and 6B is not particularly limited. For example, the conductive members 6A and 6B can be formed by exposing a photosensitive material that includes an emulsion layer including a photosensitive silver halide salt and developing the exposed photosensitive material as described in paragraphs "0067" to "0083" of JP2012-185813A, paragraphs "0115" to "0126" of JP2014-209332A, or paragraphs "0216" to "0238" of JP2015-5495A.

In addition, the conductive members can also be formed using a method including: forming metal foils on the front surface and the back surface of the transparent insulating substrate 5; patterning the metal foils by printing a resist in a pattern shape on each of the metal foils or by exposing a resist applied to the entire area of the metal foils and developing the exposed resist; and etching metal of opening portions. Further, in addition to the above-described methods, a method of printing a paste including particles of the material constituting the conductive members on the front surface and the back surface of the transparent insulating substrate 5 and plating the paste with metal; a method using an ink jet method in which an ink including particles of the material constituting the conductive members is used; a method of forming an ink including particles of the material constituting the conductive members by screen printing; a method of forming a groove on the transparent insulating substrate 5 and applying a conductive ink to the groove; or a microcontact printing patterning method can be used.

Embodiment 2

Figure 7:
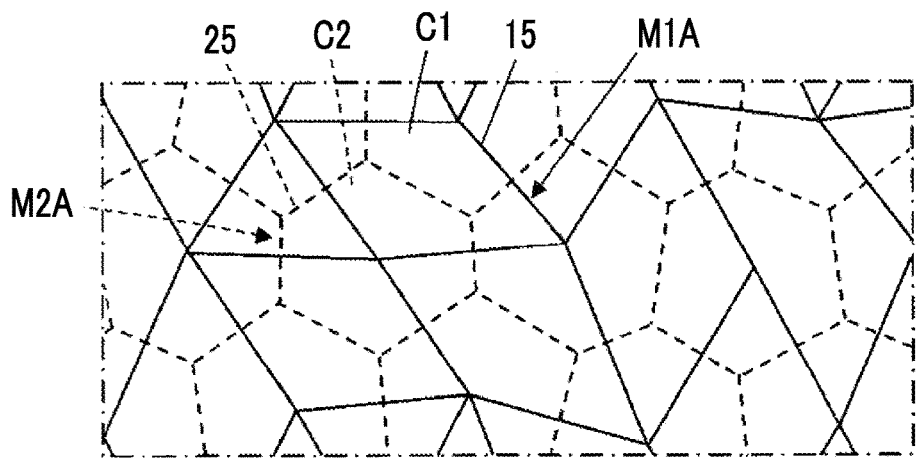
FIG. 7 is a partial plan view showing a first mesh pattern and a second mesh pattern of a conductive film for a touch panel according to Embodiment 2.
Figure 8A:
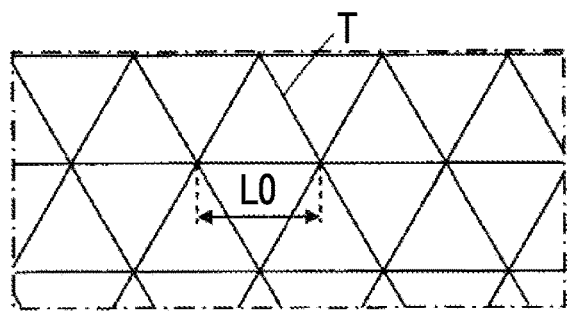
FIGS. 8A to 8F is a diagram showing a method of designing a mesh pattern of the conductive film for a touch panel according to Embodiment 2 in order of steps.
Figure 8D:
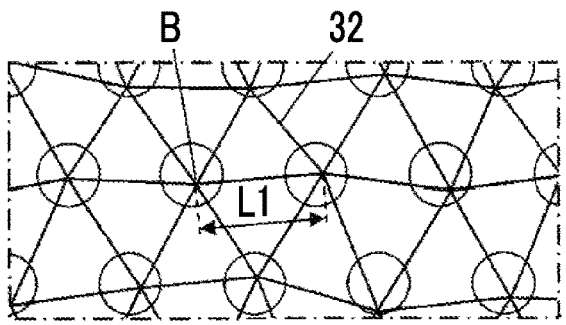
Figure 8B:
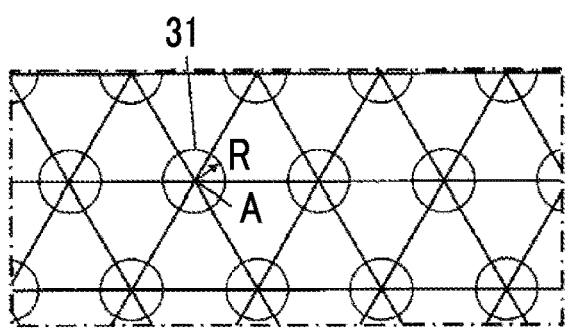
Figure 8E:
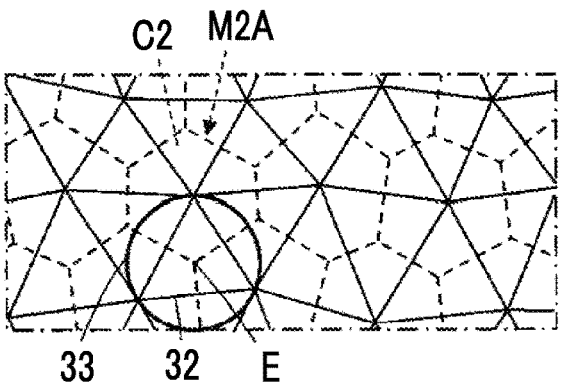
Figure 8C:
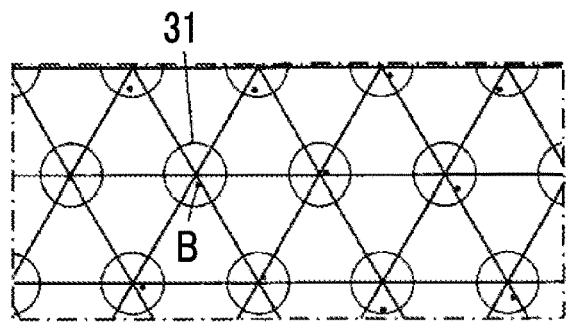
Figure 8F:
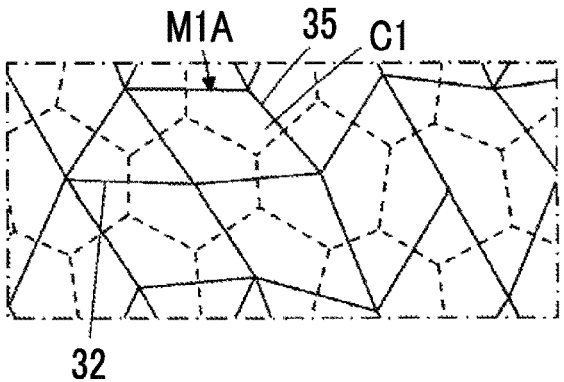

FIG. 7 shows a first mesh pattern M1A and a second mesh pattern M2A used in a conductive film for a touch panel according to Embodiment 2. In an example of Embodiment 2, in a case where the conductive film is seen from the direction perpendicular to the active area S1, substantially all the angles at which sides of first cells C1 of the first mesh pattern M1A intersect with sides of second cells C2 of the second mesh pattern M2A are 90 degrees. In this case, the sides of the first cells C1 of the first mesh pattern M1A intersect with the sides of the second cells C2 of the second mesh pattern M2A at an average angle of 80 degrees to 90 degrees in the active area S1.

In addition, as in the first mesh pattern M1 and the second mesh pattern M2 of Embodiment 1, at least one of the first mesh pattern M1A or the second mesh pattern M2A is a random pattern. The random pattern denotes that, regarding shapes of the cells forming the mesh pattern, the shape of one cell is different from that of at least one cell adjacent to the cell, and it is preferable that the shapes of all the adjacent cells C are different from each other. As shown in FIG. 7, a configuration is preferable in which both the first mesh pattern M1A and the second mesh pattern M2A are random patterns and that shapes of all the adjacent cells among the first cells C1 and the second cells C2 have different random polygonal shapes.

In addition, as shown in FIG. 7, in a case where the conductive film is seen from the direction perpendicular to the active area S1, each of the second cells C2 include at most one apex of the first cells C1. It is preferable that each of the second cells C2 includes one apex of the first cells C1.

In a case where the conductive film is seen from the direction perpendicular to the active area S1, the sides of the first cells C1 and the sides of the second cells C2 are substantially perpendicular to each other. Therefore, in a case where the touch panel 2 is used in combination with a liquid crystal display device or the like, the occurrence of moire caused by interference with a pixel pattern of the liquid crystal display device can be reduced, the parasitic capacitance of electrode intersections of the touch panel can be reduced, and the formation of portions having a locally high parasitic capacitance value can be suppressed. Therefore, the detection sensitivity can be improved, and the responsiveness of the touch panel can be improved.

Here, a method of designing the first mesh pattern M1A and the second mesh pattern M2A will be described below.

First, as shown in part A of FIG. 8, a plurality of regular triangles T having one side length L0 are tightly disposed in the active area S1.

Next, a movement tolerance R of each apex of the regular triangles T is set, a circle 31 formed around an apex A of each of the regular triangles T and having a radius R is assumed as shown in part B of FIG. 8, and the apex A of each of the regular triangles T moves in the range of the movement tolerance R of the apex using a random number. As a result, a new apex B is created as shown in part C of FIG. 8. By connecting the new apexes B to each other as shown in part D of FIG. 8, a plurality of triangles 32 having a random shape are formed. At this time, the new apex B is obtained by moving each of the apexes A of the regular triangle T in the movement tolerance R range. Therefore, the triangles 32 formed of the new apexes B have various inter-apex distances L1 in a range of ±2R with respect to the one side length L0 of the regular triangle T. That is, L0−2R≤L1≤L0+2R.

The movement tolerances R of the apexes are factors for determining the randomness of the triangles 32. In addition, it is preferable that the movement tolerance R of the apex is set to be less than the one side length L0 of the regular triangle T.

As shown in part E of FIG. 8, a circumcenter E that is the center of a circumscribed circle 33 is obtained from each of the triangles 32 having a random shape. Polygons obtained by connecting the circumcenters E to each other are set as the second cells C2 of the second mesh pattern M2A. That is, the second cells C2 are formed by drawing a perpendicular bisector of each side of each of the triangles 32.

Embodiment 2 shows a case where the circumcenters E of Embodiment 1 and the arbitrary points F match with each other. By causing the circumcenters E and the arbitrary points to match with each other, the angles at which sides of first cells C1 of the first mesh pattern M1A intersect with sides of second cells C2 of the second mesh pattern M2A can be made to be 90 degrees, and the parasitic capacitance of the electrode intersections can be further reduced.

Further, as shown in part F of FIG. 8, at least portions of adjacent triangles 32 are merged to form polygons 35 having four or more apexes. The triangles 32 and the polygons 35 are set as the first cells C1 of the first mesh pattern M1A. In part F of FIG. 8, the polygons 35 are quadrangles having four apexes. In part F of FIG. 8, in consideration of the line widths of the first thin metal wire 15 and the second thin metal wire 25, it is preferable that a difference between an opening ratio of the first mesh pattern M1A and an opening ratio of the second mesh pattern M2A in the active area S1 is 1.0% or lower. In a case where the difference between the opening ratios is 1.0% or lower, the sheet resistances of the first electrodes 11 and the second electrodes 21 can be made to uniform, and the uniformity of the sensitivity of the touch panel can be improved.

In a case where the difference between the opening ratio of the first mesh pattern M1A and the opening ratio of the second mesh pattern M2A in the active area S1 is 1.0% or lower, the triangles 32 may be used as they are as the first cells C1 of first mesh pattern M1A without forming the polygons 35.

This way, the first mesh pattern M1A and the second mesh pattern M2A shown in FIG. 7 can be designed.

From the viewpoint of reducing moire, it is preferable that the line widths of the first thin metal wire 15 and the second thin metal wire 25 are 0.5 μm to 5.0 μm.

In Embodiments 1 and 2 described above, in the conductive film 1 for a touch panel, the conductive member 6A including the first electrodes 11, the first peripheral wirings 12, the first external connection terminals 13, and the first connector portions 14 is disposed on the front surface of the transparent insulating substrate 5, and the conductive member 6B including the second electrodes 21, the second peripheral wirings 22, the second external connection terminals 23, and the second connector portions 24 is disposed on the back surface of the transparent insulating substrate 5. However, the present invention is not limited to the above-described configuration.

For example, a configuration can also be adopted in which the conductive member 6A and the conductive member 6B are disposed on one surface of the transparent insulating substrate 5 with an interlayer insulator interposed therebetween.

Further, a configuration in which two substrates are provided can also be used. That is, a configuration can also be adopted in which the conductive member 6A is disposed on a surface of a first transparent insulating substrate, the conductive member 6B is disposed on a surface of a second transparent insulating substrate, and the first transparent insulating substrate and the second transparent insulating substrate overlap with each other and used.

Further, instead of using the transparent insulating substrate 5, a configuration can also be adopted in which the conductive member 6A and the conductive member 6B are disposed on a surface of the cover panel 3 shown in FIG. 1 with an interlayer insulator interposed therebetween.

A touch panel-equipped display device can be configured by using the conductive film 1 for a touch panel according to any one of Embodiments 1 and 2 in combination with a display device. The kind of the display device is not particularly limited, and examples thereof include a liquid crystal display device (LCD), an organic electroluminescence (organic EL) display device.

In the conductive film for a touch panel according to the present invention, as described above, in a case where the line widths of the first thin metal wire and the second thin metal wire are 1 μm to 3 μm, the first cells C1 of the first mesh pattern M1 or M1A have a shape satisfying the following conditions: the average value of inter-apex distances is 500 to 900 μm; and the maximum difference Dmax between an arbitrary inter-apex distance L1 and the average value La of the inter-apex distances is 100 to 500 μm. In this case, even in a case where the conductive film for a touch panel is applied to two or more display devices having different resolutions, the occurrence of not only moire but also noise can be suppressed. That is, in the related art, it is necessary to design a mesh pattern according to each of resolutions of display devices. However, even in a case where the conductive film for a touch panel according to the present invention is applied to two or more display devices having different resolutions and is common to the display devices, the occurrence of moire and noise is suppressed in each of the display devices. Therefore, it is not necessary to design a mesh pattern according to each of the display device. The common conductive film for a touch panel refers to a conductive film for a touch panel in which the average line widths of the first thin metal wire 15 and the second thin metal wire 25 and the first mesh pattern M1 or M1A and the second mesh pattern M2 or M2A are common.

EXAMPLES

The present invention will be described in more detail based on the following examples. Materials, used amounts, ratios, treatment details, treatment procedures, and the like shown in the following examples can be appropriately changed within a range not departing from the scope of the present invention. Accordingly, the scope of the present invention is not limited to the following examples.

Example 1

The first mesh pattern M1A and the second mesh pattern M2A were designed using the design method described in Embodiment 2 such that the line widths of the first thin metal wire 15 and the second thin metal wire 25 were 2 μm, one side length L0 of the regular triangles T tightly disposed in the active area S1 was 900 μm, and the movement tolerance R of the apex was 50 μm. That is, a plurality of triangles having randomness were formed based on the movement tolerance R of the apex, and circumcenters of the triangles were connected to each other. As a result, the second cells C2 of the second mesh pattern M2A were formed, and the first cells C1 of the first mesh pattern M1A were formed using the triangles. During the formation of the first cells C1, some of the triangles were merged such that a difference between the opening ratio of the first mesh pattern M1A and the opening ratio of the second mesh pattern M2A was 1.0% or lower. As a result, the first cells C1 including a plurality of quadrangles and the triangles were formed.

The first conductive layer 8 in which the first thin metal wire 15 was disposed along the first mesh pattern M1A and the second conductive layer 9 in which the second thin metal wire 25 was disposed along the second mesh pattern M2A are disposed to overlap with each other in the transparent active area S1. As a result the conductive film 1 for a touch panel shown in FIG. 2 was manufactured. As shown in FIG. 6, dummy electrodes were provided between the electrodes.

In addition, in order to design a mesh pattern, a unit mesh pattern having a size of 5 mm×5 mm was formed, the unit mesh pattern was repeatedly disposed, and mesh lines were created such that upper, lower, left, and right mesh lines were connected in boundary portions between the unit mesh patterns. As a result, a mesh pattern was formed in the entire active area. It is preferable that the size of the unit mesh pattern is an integer multiple of an electrode pitch of the touch panel.

Here, the conductive film 1 for a touch panel was prepared by exposing a photosensitive material including an emulsion layer having a photosensitive silver halide salt described below and developing the exposed photosensitive material.

(Preparation of Silver Halide Emulsion)

The following solution 2 and the following solution 3 were simultaneously added for 20 minutes to the following solution 1 held at pH 4.5 and 38° C. in amounts corresponding to 90% of the entire amounts while stirring the solutions. As a result, nuclear particles having a size of 0.16 μm were formed. Next, the following solution 4 and the following solution 5 were added for 8 minutes, and the remaining 10% amounts of the solution 2 and the solution 3 were further added for 2 minutes. As a result, the nuclear particles grew to a size of 0.21 μm. Further, 0.15 g of potassium iodide was added, and the particles were aged for 5 minutes. Then the formation of the particles was completed.

Solution 1
Water: 750 ml
Gelatin: 9 g
Sodium chloride: 3 g
1,3-Dimethylimidazolidine-2-thione: 20 mg
Sodium benzenethiolsulfonate: 10 mg
Citric acid: 0.7 g
Solution 2
Water: 300 ml
Silver nitrate: 150 g
Solution 3
Water: 300 ml
Sodium chloride: 38 g
Potassium bromide: 32 g
Potassium hexachloroiridate(III) (0.005% KCL 20% aqueous solution): 8 ml
Ammonium hexachlororhodate (0.001% NaCl 20% aqueous solution): 10 ml
Solution 4
Water: 100 ml
Silver nitrate: 50 g
Solution 5
Water: 100 ml
Sodium chloride: 13 g
Potassium bromide: 11 g
Potassium ferrocyanide: 5 mg Next, the particles were washed with water by flocculation using an ordinary method. Specifically, the temperature was decreased to 35° C., and the pH was decreased (to be in a range of pH 3.6±0.2) using sulfuric acid until silver halide precipitated. Next, about 3 L of the supernatant liquid was removed (first water washing). Further, 3 L of distilled water was added, and sulfuric acid was added until silver halide precipitated. Next, about 3 L of the supernatant liquid was removed again (second water washing). By repeating the same operation as the second washing once more (third water washing), the water washing and desalting step was completed. After the water washing and desalting, the emulsion was adjusted to pH 6.4 and pAg 7.5, 3.9 g of gelatin, 10 mg of sodium benzenethiolsulfonate, 3 mg of sodium benzenethiosulfmate, 15 g of sodium thiosulfate, and 10 mg of chloroauric acid were added, and chemosensitization was performed at 55° C. to obtain the optimum sensitivity. Next, 100 mg of 1,3,3a,7-tetraazaindene as a stabilizer and 100 mg of PROXEL (trade name, manufactured by ICI Co., Ltd.) as a preservative were added. The finally obtained emulsion was a silver chloroiodobromide cubic particle emulsion having an average particle size of 0.22 μm and a coefficient of variation of 9%, in which the content of silver iodide was 0.08 mol %, and the ratio of silver chlorobromide was 70 mol % of silver chloride/30 mol % of silver bromide.

(Preparation of Composition for Forming Photosensitive Layer)

$1.2 \times 10^{-4}$ mol/mol Ag of 1,3,3a,7-tetraazaindene, $1.2 \times 10^{-2}$ mol/mol Ag of hydroquinone, $3.0 \times 10^{-4}$ mol/mol Ag of citric acid, and 0.90 g/mol Ag of 2,4-dichloro-6-hydroxy-1,3,5-triazine sodium salt were added to the emulsion, and pH of the coating solution was adjusted to 5.6 using citric acid. As a result, a composition for forming a photosensitive layer was obtained.

(Photosensitive Layer Forming Step)

A corona discharge treatment was performed on a PET substrate (thickness: 100 μm), a gelatin layer having a thickness of 0.1 μm as a undercoat layer was provided on opposite surfaces of the PET substrate, and an antihalation layer including a dye having an optical density of about 1.0 and decolorized by an alkali developer was provided on the undercoat layer. The composition for forming a photosensitive layer was applied to the antihalation layer, and a gelatin layer having a thickness of 0.15 μm was further provided. As a result, a resin substrate having opposite surfaces on which the photosensitive layer was formed was obtained. A resin substrate having opposite surfaces on which the photosensitive layer was formed was set as a film A. In the formed photosensitive layer, the silver content was 6.0 g/m², and the gelatin content was 1.0 g/m².

(Exposure Development Step)

Opposite surfaces of the film A were exposed using parallel light of a high pressure mercury lamp as a light source through photomasks corresponding to patterns of the conductive members. After the exposure, the surfaces of the film A were developed using the following developer and were developed using a fixing solution (trade name; N3X-R for CN16X, manufactured by Fuji Film Co., Ltd.). Further, the film A was rinsed with pure water and was dried. As a result, a resin substrate having opposite surfaces on which the conductive member formed of Ag wire and the gelatin layer were formed was obtained. The gelatin layer was formed between the Ag wires. The obtained film was set as a film B.

(Composition of Developer)

1 L of the developer included the following compounds.
Hydroquinone: 0.037 mol/L
N-methylamino phenol: 0.016 mol/L
Sodium metaborate: 0.140 mol/L
Sodium hydroxide: 0.360 mol/L
Sodium bromide: 0.031 mol/L
Potassium metabisulfite: 0.187 mol/L (Heating Step)

The film B was left to stand in a superheated steam bath at 120° C. for 130 seconds to heat the film B. The heated film was set as a film C. This film C was the conductive film 1 for a touch panel.

Examples 2 to 5

Conductive films for a touch panel according to Examples 2 to 5 were prepared using the same method as in Example 1, except that the movement tolerance R of the apex was changed to 100 μm, 150 μm, 200 μm, or 250 μm while maintaining one side length L0 of the regular triangles T at 900 μm.

Examples 6 to 10

Conductive films for a touch panel according to Examples 6 to 10 were prepared using the same method as in Example 1, except that one side length L0 of the regular triangles T was changed to 700 μm and the movement tolerance R of the apex was changed to 50 μm, 100 μm, 150 μm, 200 μm, or 250 μm.

Examples 11 to 15

Conductive films for a touch panel according to Examples 11 to 15 were prepared using the same method as in Example 1, except that one side length L0 of the regular triangles T was changed to 600 μm and the movement tolerance R of the apex was changed to 50 μm, 100 μm, 150 μm, 200 μm, or 250 μm.

Examples 16 to 19

Conductive films for a touch panel according to Examples 16 to 19 were prepared using the same method as in Example 1, except that one side length L0 of the regular triangles T was changed to 500 μm and the movement tolerance R of the apex was changed to 50 μm, 100 μm, 150 μm, or 200 μm.

Examples 20 to 22

Conductive films for a touch panel according to Examples 20 to 22 were prepared using the same method as in Example 1, except that one side length L0 of the regular triangles T was changed to 400 μm and the movement tolerance R of the apex was changed to 50 μm, 100 μm, or 150 μm.

Examples 23 and 24

Conductive films for a touch panel according to Examples 23 and 24 were prepared using the same method as in Example 1, except that one side length L0 of the regular triangles T was changed to 300 μm and the movement tolerance R of the apex was changed to 50 μm, or 100 μm.

Comparative Examples 1 to 6

Conductive films for a touch panel according to Comparative Examples 1 to 6 were prepared using the same method as in Example 1, except that one side length L0 of the regular triangles T was changed to 900 μm, 700 μm, 600 μm, 500 μm, 400 μm, or 300 μm and the movement tolerance R of the apex was changed to 0 μm.

Comparative Example 7

A conductive film for a touch panel according to Comparative Example 7 was prepared using the same method as in Example 1, except that the first cells of the first mesh pattern and the second cells of the second mesh pattern were created using a Voronoi diagram based on the description of JP2011-216377A.

Comparative Example 8

A conductive film for a touch panel according to Comparative Example 8 was prepared using the same method as in Example 1, except that the first cells of the first mesh pattern and the second cells of the second mesh pattern were created using a Delaunay triangulation method based on the description of JP2011-216377A.

Regarding the conductive film for a touch panel according to each of Examples 1 to 24 and Comparative Examples 1 to 8, the responsiveness of the touch panel, the occurrence of moire, and the occurrence of noise were evaluated.

Method of Evaluating Responsiveness of Touch Panel

The responsiveness was evaluated as follows.

A glass plate having a thickness of 0.55 mm, an OCA having a thickness of 0.1 mm, the conductive film for a touch panel according to each of Examples 1 to 24 and Comparative Examples 1 to 8 having a thickness of 0.1 mm, an OCA having a thickness of 0.1 mm, and a PET film having a thickness of 0.05 mm were bonded in this order to create a touch panel module. This touch panel module was connected to IC (manufactured by Atmel Corporation). The touch panel module is driven, a touch pen having a tip diameter of 2 mm was moved on the glass surface, and the reaction at this time was evaluated in five grades as follows.

In the evaluation of the responsiveness, a level where the touch panel reacted without stress even in a case where the touch pen was moved at a high speed was shown as the evaluation result A, a level where the touch panel reacted without problems in practice even in a case where the touch pen was moved at a high speed was shown as the evaluation result B, a level where the touch panel reacted without problems in practice even in a case where the touch pen was moved at a low speed was shown as the evaluation result C, a level where a position pointed by the touch pen was different from a reaction position of the touch panel was shown as the evaluation result D, and a level where a position pointed by the touch pen was not able to be recognized was shown as the evaluation result E.

Method of Evaluating Occurrence of Moire

The conductive film for a touch panel according to each of Examples 1 to 24 and Comparative Examples 1 to 8 was disposed on liquid crystal display devices having different resolutions to evaluate the occurrence of moire.

As the liquid crystal display devices used for the evaluation, four liquid crystal display device including a display 1 (manufactured by ASUSTeK Computer Inc.) having a size of 13.3 inch (338 mm) and a resolution of 118 dpi, a display 2 (manufactured by LG Electronics Incorporated) having a size of 10.1 inch (257 mm) and a resolution of 149 dpi, a display 3 (manufactured by Toshiba Corporation) having a size of 13.3 inch (338 mm) and a resolution of 221 dpi, and a display 4 (manufactured by LG Electronics Incorporated) having a size of 4.3 inch (109 mm) and a resolution of 342 dpi were used.

In the evaluation of the occurrence of moire, the evaluation result A represents a high level where the occurrence of moire was not recognized, the evaluation result B represents a level where the occurrence of moire was slightly recognized but there were no problems in the touch panel, the evaluation result C represents a level where moire occurred such that there were problems in the touch panel, and the evaluation result D represents a level where moire severely occurred such that the touch panel was not able to be used.

Method of Evaluating Occurrence of Noise

The conductive film for a touch panel according to each of Examples 1 to 24 and Comparative Examples 1 to 8 was disposed on liquid crystal display devices having different resolutions to evaluate the occurrence of noise. In the evaluation of the occurrence of noise, two patterns of white and green were used as display colors of the liquid crystal display devices.

The liquid crystal display devices used in the evaluation were the same as those described above in "Evaluation of Occurrence of Moire".

In the evaluation of the occurrence of noise, the evaluation result A represents a high level where the occurrence of noise was not recognized in both the white and green patterns, the evaluation result B represents a high level where the occurrence of noise was not recognized in the white pattern, the occurrence of noise was slightly recognized in the green pattern, and there were no problems in using the touch panel, the evaluation result C represents a level where the occurrence of noise was recognized in both the white and green patterns but there were no problems in using the touch panel, and the evaluation result D represents a level where noise severely occurred in both the white and green patterns and there were problems in using the touch panel.

In addition, in the conductive film for a touch panel according to each of Examples 1 to 24 and Comparative Examples 1 to 8, angles at which the sides of the first cells and the sides of the second cells intersected with each other were measured at 100 intersections in the active area, and the average thereof was calculated.

The evaluation results and the average value of the intersection angles of Examples 1 to 24 and Comparative Examples 1 to 8 are shown in Table 1.

TABLE 1

| | One Side Length L0 (μm) of Regular Triangle | movement tolerant R(μm) | Average Value of Intersection Angles | Responsiveness | Display 1 | | Display 2 | | Display 3 | | Display 4 | |
|---|---|---|---|---|---|---|---|---|---|---|---|---|
| | | | | | Moire | Noise | Moire | Noise | Moire | Noise | Moire | Noise |
| Example 1 | 900 | 50 | 88 Degrees | A | A | A | A | A | A | A | A | A |
| Example 2 | 900 | 100 | 87 Degrees | A | A | A | A | A | A | A | A | A |
| Example 3 | 900 | 150 | 85 Degrees | A | A | A | A | A | A | A | A | A |

TABLE 1-continued

| | One Side Length L0 (μm) of Regular Triangle | movement tolerant R(μm) | Average Value of Intersection Angles | Responsiveness | Display 1 | | Display 2 | | Display 3 | | Display 4 | |
|---|---|---|---|---|---|---|---|---|---|---|---|---|
| | | | | | Moire | Noise | Moire | Noise | Moire | Noise | Moire | Noise |
| Example 4 | 900 | 200 | 84 Degrees | A | A | A | A | A | A | A | A | A |
| Example 5 | 900 | 250 | 82 Degrees | A | A | A | A | A | A | A | A | A |
| Example 6 | 700 | 50 | 88 Degrees | A | A | A | A | A | A | A | A | A |
| Example 7 | 700 | 100 | 85 Degrees | A | A | A | A | A | A | A | A | A |
| Example 8 | 700 | 150 | 84 Degrees | A | A | A | A | A | A | A | A | A |
| Example 9 | 700 | 200 | 82 Degrees | A | A | A | A | A | A | A | A | A |
| Example 10 | 700 | 250 | 81 Degrees | A | A | A | A | A | A | A | A | A |
| Example 11 | 600 | 50 | 87 Degrees | A | A | A | A | A | A | A | A | A |
| Example 12 | 600 | 100 | 85 Degrees | A | A | A | A | A | A | A | A | A |
| Example 13 | 600 | 150 | 85 Degrees | A | A | A | A | A | A | A | A | A |
| Example 14 | 600 | 200 | 81 Degrees | A | A | A | A | A | A | A | A | A |
| Example 15 | 600 | 250 | 80 Degrees | A | A | A | A | A | A | A | A | A |
| Example 16 | 500 | 50 | 87 Degrees | A | A | A | A | A | A | A | A | A |
| Example 17 | 500 | 100 | 85 Degrees | A | A | A | A | A | A | A | A | A |
| Example 18 | 500 | 150 | 82 Degrees | A | A | A | A | A | A | A | A | A |
| Example 19 | 500 | 200 | 80 Degrees | A | A | A | A | A | A | A | A | A |
| Example 20 | 400 | 50 | 87 Degrees | A | A | A | A | A | A | B | A | B |
| Example 21 | 400 | 100 | 82 Degrees | A | A | A | A | B | A | B | A | B |
| Example 22 | 400 | 150 | 80 Degrees | A | A | B | A | B | A | B | A | B |
| Example 23 | 300 | 50 | 85 Degrees | A | A | A | A | A | A | B | A | B |
| Example 24 | 300 | 100 | 82 Degrees | A | A | B | A | B | A | B | A | B |
| Comparative Example 1 | 900 | 0 | 90 Degrees | A | C | A | C | A | C | B | C | B |
| Comparative Example 2 | 700 | 0 | 90 Degrees | A | C | A | C | A | C | B | C | B |
| Comparative Example 3 | 600 | 0 | 90 Degrees | A | C | A | C | A | C | B | C | B |
| Comparative Example 4 | 500 | 0 | 90 Degrees | A | D | A | D | A | D | B | C | B |
| Comparative Example 5 | 400 | 0 | 90 Degrees | A | D | A | D | A | C | B | C | B |
| Comparative Example 6 | 300 | 0 | 90 Degrees | A | C | A | D | A | C | A | D | B |
| Comparative Example 7 | 900 | 50 | 60 Degrees | D | A | A | A | B | A | C | A | C |
| Comparative Example 8 | 900 | 50 | 50 Degrees | D | A | A | A | B | A | C | A | C |

In all the conductive films for a touch panels according to Examples 1 to 24, the evaluation results of the responsiveness of the touch panel modules were A, and when used in combination with the displays 1 to 4, the evaluation results of the occurrence of moire were A. It was found that in the conductive films for a touch panel, the occurrence of moire was reduced and the responsiveness of the touch panel was improved.

In Comparative Example 7 in which the first cells of the first mesh pattern and the second cells of the second mesh pattern were created using a Voronoi diagram, the average value of the angles at which the sides of the first cells and the sides of the second cells intersected with each other was 60 degrees. In Comparative Example 8 in which the first cells of the first mesh pattern and the second cells of the second mesh pattern were created using a Delaunay triangulation method, the average value of the angles at which the sides of the first cells and the sides of the second cells intersected with each other was 50 degrees. In Comparative Examples 7 and 8, the average value of the intersection angles was low. Therefore, it is presumed that portions having a locally high parasitic capacitance were formed in the electrode intersections, and the overall parasitic capacitance increased, and thus the evaluation result of the responsiveness was D.

On the other hand, in the conductive films for a touch panels according to Examples 1 to 24, the average value of the angles at which the sides of the first cells and the sides of the second cells intersected with each other was 80 degrees to 88 degrees, which was a high value similar to 90 degrees. Therefore, it is presumed that no portions having a locally high parasitic capacitance were formed in the electrode intersections, the overall parasitic capacitance was able to be reduced, and thus the evaluation results of the responsiveness were A.

In Comparative Examples 1 to 6, the movement tolerance R of the apex was 0 μm. Therefore, the second cells C2 of the second mesh pattern M2 were formed by connecting the circumcenters of the regular triangles, and the first cells C1 of the first mesh pattern M1A were formed using the regular triangles. Thus, the first cells C1 included only the regular triangles, the second cells C2 included only the regular hexagons, and both the first mesh pattern M1A and the second mesh pattern M2A were so-called fixed patterns in which the cells having the same shape were repeated. The first mesh pattern M1A and the second mesh pattern M2A were fixed patterns and were periodic. Therefore, moire occurred, and the evaluation results of moire C or D.

In Comparative Examples 1 to 6, the movement tolerance R of the apex was 0 μm. Therefore, the circumcenters of the triangles forming the first cells C1 were used as they are as the apexes of the second cells C2, and all the angles at which the sides of the first cells and the sides of the second cells intersected with each other were 90 degrees. Thus, the evaluation results of the responsiveness were A.

Further, it was found that, even in a case where the conductive film for a touch panels according to each of Examples 1 to 24 was used in common to liquid crystal display devices having different resolutions, not only the occurrence of moire but also the occurrence of noise were able to be suppressed as compared to Comparative Examples 7 and 8.

In particular, in a case where one side length L0 of the regular triangles T tightly disposed to form the first cells C1 of the first mesh pattern M1A was 500 to 900 μm as in Examples 1 to 19, the movement tolerance R of the apex was appropriately selected in a range of 50 to 250 μm. As a result, even in a case where the conductive film was used in common to various liquid crystal display devices having different resolutions, the evaluation results of the conductive film for a touch panel were at high levels where moire and noise were not recognized.

EXPLANATION OF REFERENCES

1: conductive film for a touch panel
2: touch panel
3: cover panel
4: adhesive
5: transparent insulating substrate
6A, 6B: conductive member
7A, 7B: protective layer
8: first conductive layer
9: second conductive layer
11: first electrode
11A: first dummy electrode
12: first peripheral wiring
13: first external connection terminal
14: first connector portion
15: first thin metal wire
21: second electrode
22: second peripheral wiring
23: second external connection terminal
24: second connector portion
25: second thin metal wire
31, 34, 34A, 34B: circle
32, 32A, 32B: triangle
33, 33A, 33B: circumscribed circle
35: polygon
S1: active area
S2: peripheral area
D1: first direction
D2: second direction
C1: first cell
M1, M1A: first mesh pattern
C2: second cell
M2, M2A: second mesh pattern
T: regular triangle
A, B: apex
L0: one side length of regular triangle
L1: inter-apex distance
La: average of inter-apex distances
R: movement tolerance of apex
E, EA, EB: circumcenter
F, FA, FB: arbitrary point
W: overlapping portion

What is claimed is:

1. A method of designing a mesh pattern of a conductive film for a touch panel, the method comprising:
   a first step of tightly disposing a plurality of polygons having an arbitrary shape in an area to form a transparent active area in which a first conductive layer and a second conductive layer are disposed to overlap each other, the first conductive layer including a first thin metal wire disposed along a first mesh pattern formed of a plurality of first cells having a polygonal shape, and the second conductive layer including a second thin metal wire disposed along a second mesh pattern formed of a plurality of second cells having a polygonal shape;
   a second step of obtaining a circumcenter of each of the polygons;
   a third step of disposing one arbitrary point in each of the polygons to be positioned at a distance, which is less than ½ a radius of a circumscribed circle of the polygon, from the circumcenter;
   a fourth step of forming a pattern for forming the second cells by connecting two arbitrary points corresponding to two polygons that share each of sides of the polygons; and
   a fifth step of forming a pattern for forming the first cells using the polygons,
   wherein the polygons having a random shape are disposed in the first step, and/or the arbitrary point is randomly disposed in the third step.

2. The method of designing a mesh pattern of a conductive film for a touch panel according to claim 1,
   wherein the polygons disposed in the first step are formed of a plurality of triangles.

3. The method of designing a mesh pattern of a conductive film for a touch panel according to claim 2,
   wherein the triangles disposed in the first step have a random shape.

4. The method of designing a mesh pattern of a conductive film for a touch panel according to claim 2,
   wherein each of the polygons disposed in the first step has a random polygonal shape in which an average value of inter-apex distances is 300 to 900 μm and in which a maximum difference between an arbitrary inter-apex distance and the average value of the inter-apex distances is 50 to 500 μm.

5. The method of designing a mesh pattern of a conductive film for a touch panel according to claim 2, the method further comprising:
   a step of determining line widths of the first thin metal wire and the second thin metal wire,
   wherein the line widths of the first thin metal wire and the second thin metal wire are set to be 1 μm to 3 μm, and each of the polygons disposed in the first step has a random polygonal shape in which an average value of inter-apex distances is 500 to 900 μm and in which a maximum difference between an arbitrary inter-apex distance and the average value of the inter-apex distances is 100 to 500 μm.

6. The method of designing a mesh pattern of a conductive film for a touch panel according to claim 4,
   wherein each of the polygons disposed in the first step is formed by moving each of apexes of a regular polygon having one side length of 300 to 900 μm in a movement tolerance range of 25 to 250 μM.

7. The method of designing a mesh pattern of a conductive film for a touch panel according to claim 2,
   wherein the arbitrary point disposed in each of the triangles in the third step matches with a circumcenter of the triangle.

8. The method of designing a mesh pattern of a conductive film for a touch panel according to claim 2, wherein as the pattern for forming the first cells formed in the fifth step, the triangles disposed in the first step are used as they are.

9. The method of designing a mesh pattern of a conductive film for a touch panel according to claim 2,
wherein the pattern for forming the first cells formed in the fifth step includes a polygon having four or more apexes that is formed by merging at least portions of triangles adjacent to each other among the triangles disposed in the first step.

10. The method of designing a mesh pattern of a conductive film for a touch panel according to claim 2, the method further comprising:
a step of determining line widths of the first thin metal wire and the second thin metal wire,
wherein in the fifth step, the pattern for forming the first cells is formed, the first cells formed such that a difference between an opening ratio of the first mesh pattern and an opening ratio of the second mesh pattern in the active area is 1.0% or lower with respect to the determined line widths of the first thin metal wire and the second thin metal wire.

11. A method of manufacturing a conductive film for a touch panel, the method comprising:
designing a mesh pattern using the method of designing a mesh pattern of a conductive film for a touch panel according to claim 1, and
disposing the first conductive layer and the second conductive layer to overlap each other in the active area using the mesh pattern designed by the method of designing.

12. A conductive film for a touch panel, the conductive film comprising:
a first conductive layer that includes a first thin metal wire disposed along a first mesh pattern formed of a plurality of first cells having a polygonal shape;
a second conductive layer that includes a second thin metal wire disposed along a second mesh pattern formed of a plurality of second cells having a polygonal shape,
wherein the first conductive layer and the second conductive layer are disposed to overlap each other in a transparent active area,
the second cells have a random shape,
each of the second cells includes at most one apex of the first cells in a case where the conductive film is seen from a direction perpendicular to the active area, and
sides of the first cells and sides of the second cells intersect with each other at an average angle of 75 degrees to 90 degrees in the active area.

13. The conductive film for a touch panel according to claim 12,
wherein the first cells are formed of a plurality of polygons tightly disposed in the active area.

14. The conductive film for a touch panel according to claim 13,
wherein the polygons are formed of a plurality of triangles.

15. The conductive film for a touch panel according to claim 13,
wherein the polygons have a random shape.

16. The conductive film for a touch panel according to claim 13,
wherein each of the first cells has a random polygonal shape in which an average value of inter-apex distances is 300 to 900 μm and in which a maximum difference between an arbitrary inter-apex distance and the average value of the inter-apex distances is 50 to 500 μm.

17. The conductive film for a touch panel according to claim 13,
wherein a difference between an opening ratio of the first mesh pattern and an opening ratio of the second mesh pattern in the active area is 1.0% or lower.

18. The conductive film for a touch panel according to claim 13,
wherein line widths of the first thin metal wire and the second thin metal wire are 1 μm to 3 μm.

19. The conductive film for a touch panel according to claim 18,
wherein each of the first cells has a random polygonal shape in which an average value of inter-apex distances is 500 to 900 μm and in which a maximum difference between an arbitrary inter-apex distance and the average value of the inter-apex distances is 100 to 500 μm.

20. The conductive film for a touch panel according to claim 12,
wherein the first conductive layer includes at least a plurality of first electrodes and a plurality of first dummy electrodes,
the first electrodes are disposed at intervals,
the first dummy electrodes are disposed between the first electrodes and are insulated from the first electrodes,
the second conductive layer includes at least a plurality of second electrodes and a plurality of second dummy electrodes,
the second electrodes are disposed at intervals to intersect with the first electrodes,
the second dummy electrodes are disposed between the second electrodes and are insulated from the second electrodes, and
the first electrodes and the second electrodes are disposed in a state where the first electrodes and the second electrodes are insulated from each other.

* * * * *